United States Patent
Sasai et al.

[11] Patent Number: 6,128,223
[45] Date of Patent: Oct. 3, 2000

[54] SEMICONDUCTOR MEMORY DEVICE

[75] Inventors: Toshihiro Sasai, Kyoto; Youichi Nakasone, Ibaraki, both of Japan

[73] Assignee: NuCORE Technology, Inc., Santa Clara, Calif.

[21] Appl. No.: 09/274,493

[22] Filed: Mar. 23, 1999

[30] Foreign Application Priority Data

Mar. 26, 1998 [JP] Japan .................................. 10-079129

[51] Int. Cl.[7] .................................................. G11C 16/04
[52] U.S. Cl. .................................. 365/185.18; 365/185.26
[58] Field of Search ...................... 365/185.18, 185.28, 365/185.1, 185.26; 257/315

[56] References Cited

U.S. PATENT DOCUMENTS

| | | | |
|---|---|---|---|
| 4,661,833 | 4/1987 | Mizutani | 357/54 |
| 5,338,952 | 8/1994 | Yamauchi | 257/315 |
| 5,414,286 | 5/1995 | Yamauchi | 257/315 |
| 5,596,529 | 1/1997 | Noda et al. | 365/185.28 |

*Primary Examiner*—Richard Elms
*Assistant Examiner*—Anh Phung
*Attorney, Agent, or Firm*—Townsend and Townsend and Crew LLP; Kenneth R. Allen

[57] ABSTRACT

A semiconductor memory device includes a memory cell and first and second electrodes. The memory cell has a floating gate formed on a semiconductor substrate via a gate insulating film to be insulated from a remaining part, and a control gate formed on the floating gate via an isolation insulating film. The first electrode is formed on the floating gate via a first insulating film in a region of the floating gate except for a channel region for constituting the memory cell. The second electrode is formed on the floating gate via a second insulating film in a region of the floating gate except for the channel region for constituting the memory cell. When a predetermined voltage is applied to the first and second electrodes, a tunnel current flows through the first and second insulating films.

6 Claims, 7 Drawing Sheets

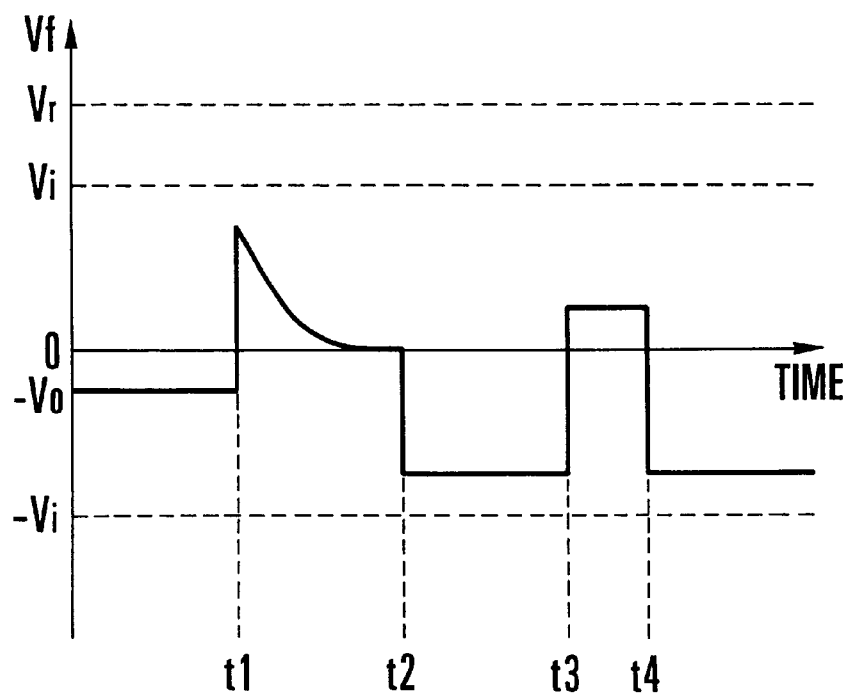
F I G. 2
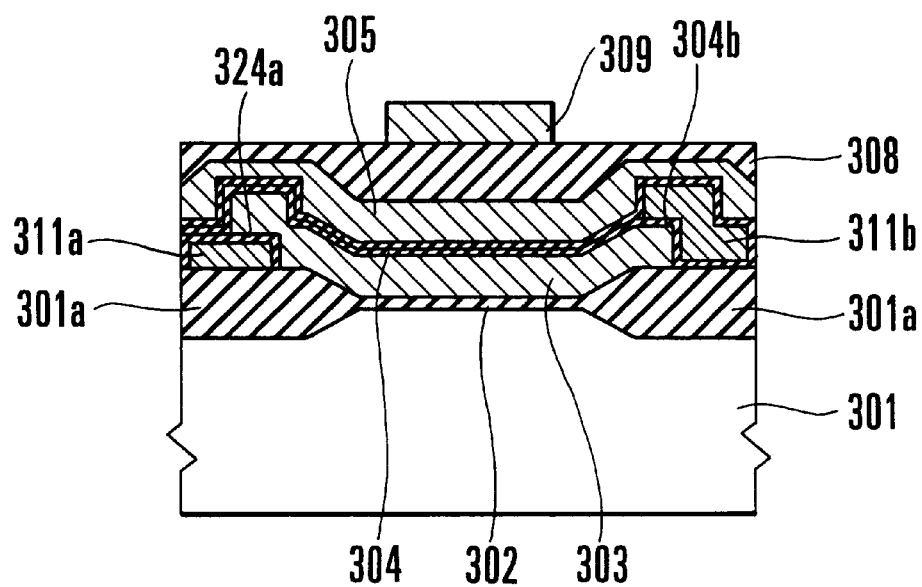
F I G. 3

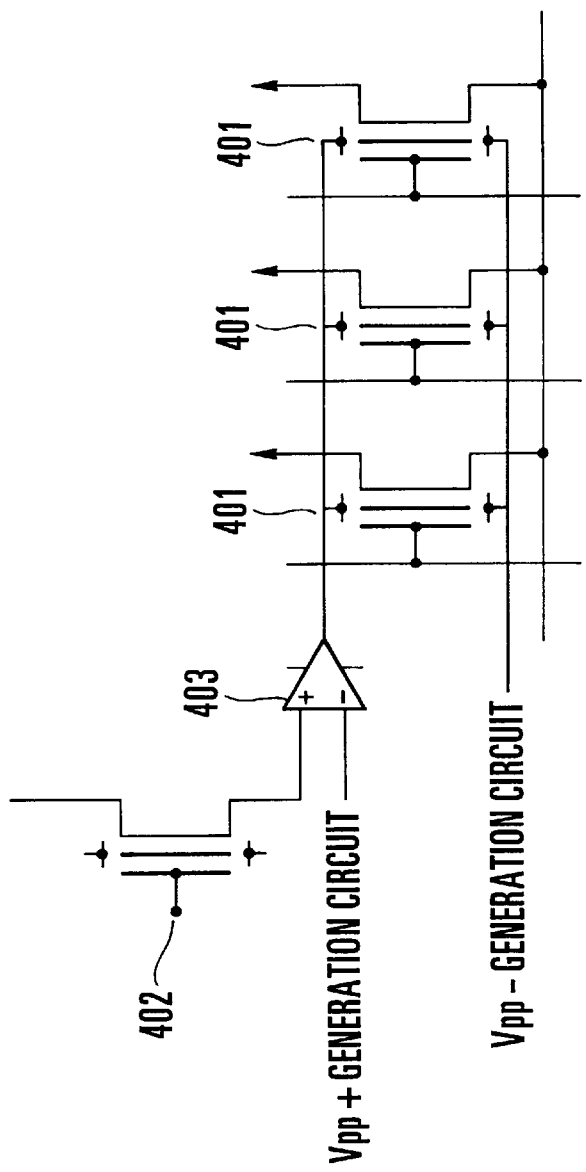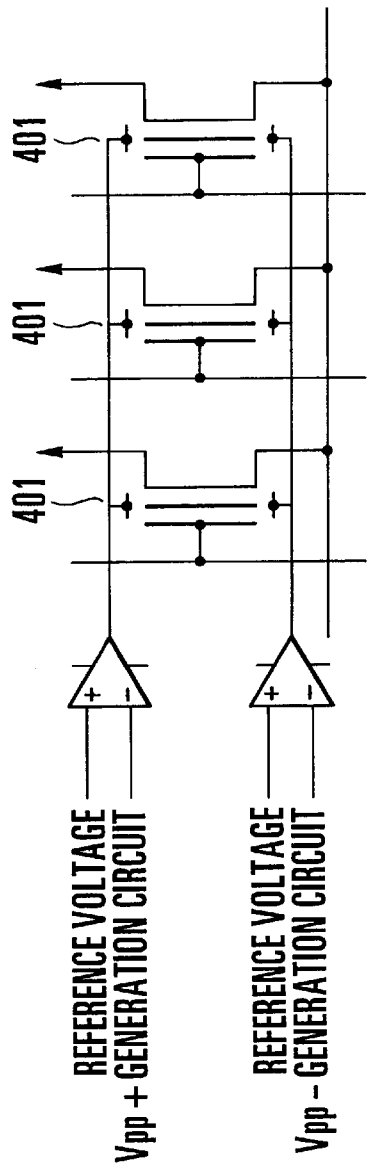
FIG. 4A
FIG. 4B

SEMICONDUCTOR MEMORY DEVICE

BACKGROUND OF THE INVENTION

The present invention relates to a semiconductor memory device having an electrically programmable and erasable memory cell.

The most typical one of conventional nonvolatile semiconductor memories is a stacked flash memory using two-layered polysilicon. FIGS. 6A and 6B show the memory cell of the flash memory. In this memory cell, a floating gate 603 is formed on a semiconductor substrate 601 via a gate insulating film 602, a control gate 605 is formed on the floating gate 603 via an isolation insulating film 604, and an impurity-doped source 606 and drain 607 are formed on the two sides of the floating gate 603 in the semiconductor substrate 601.

In this memory cell, for example, data is erased by grounding the control gate 605, applying a high voltage Vpp (about 12 V) to the source 606, and extracting electrons from the floating gate 603 by an FN tunnel current between the source 606 and floating gate 603, as shown in FIG. 6A.

Data is written using hot electron injection by injecting electrons into the floating gate 603, as shown in FIG. 6B.

In this case, injecting electrons into the floating gate means "write".

The erase is generally performed by the following procedure (intelligent erase).

To prevent an over erase, data is written in all memory cells (electrons are satisfactorily injected into floating gates).

An erase using a pulse of about 10 msec and a read (erase verify) for verifying the erase are repeatedly performed until the maximum values of the thresholds (Vth) of all memory cell transistors become equal to or smaller than a predetermined voltage (about 3 V).

A write is performed by a similar procedure. A write using a write pulse of about 10 μsec and a read for verifying the transistor threshold level are repeatedly performed until the maximum value of the threshold of each memory cell transistor becomes equal to or larger than a predetermined voltage (about 7 V).

FIG. 7 shows the threshold distribution of an erased/written memory cell by the above intelligent erase method. In general, the threshold is distributed in the wide ranges of 6 V or more in a written memory cell and 0.5 V to 3 V in an erased memory cell owing to variations between memory cells caused by variations in wafer manufacturing process such as the film thickness or gate length.

In the above-described memory cell structure, the threshold varies in this manner, and a write is difficult to perform so as to extract a desired voltage including variations in threshold. This interferes with realizing multilevel digital or analog memories.

FIG. 8 shows the structure of a split gate type nonvolatile memory (the structure of a memory cell). In this memory cell, a floating gate 803 is formed on a semiconductor substrate 801 via a gate insulating film 802, and a control gate 805 is formed on the floating gate 803 via an isolation insulating film 804. As the characteristic feature of the memory cell, part of the control gate 805 extends up to the gate insulating film 802 on a side of the floating gate 803. An impurity-doped source 806 is formed on a side of the control gate 805 on the gate insulating film 802 in the semiconductor substrate 801, and an impurity-doped drain 807 is formed on a side of the floating gate 803.

In this memory cell, since the extending portion of the control gate 805 functions as a select transistor, the selectivity can be maintained even if the transistor is depleted by an over erase. That is, since this structure is less susceptible to over erase, no write need be performed first, or no operation such as intelligent erase of sequentially checking the erase state need be performed. The threshold distribution can be used to a lower voltage side, and thus a value can be written in a wider voltage range.

Except for this, however, the split gate type memory is basically the same as the stacked memory described above, and analog values or multilevel digital values are also difficult to write.

As a technique for realizing a write of analog values or multilevel digital values, a pulse write method using a ramp voltage and a method of controlling a write while monitoring a reference value and a memory output by a comparator are proposed.

An example of the analog value write method using a ramp voltage will be explained. In this method, zero data is first written in all memory cells as initialization (electrons are satisfactorily injected into floating gates). A voltage is roughly sampled from a high-voltage source whose output voltage gradually changes by a pulse having a constant width (e.g., about 100 μsec), and a coarse pulse is applied to the drain of a target memory cell.

At this time, the control gate is grounded to 0 V, and electrons are gradually extracted from the floating gate by an FN current. After a high voltage is applied to the drain of the memory cell for a time corresponding to the constant-width pulse, application of the high voltage for a write is stopped, and a read starts.

When the control gate and drain are set to a read voltage (5 V), a voltage corresponding to the remaining charge amount of the floating gate appears on the source side, and is read by a source follower circuit, and is compared by the comparator with a set voltage value to be written.

If the read value reached the predetermined value, the read shifts to a next fine write sequence; if the read value is smaller, a rough write voltage increased by a predetermined magnitude by a next coarse pulse is applied to the drain. This operation is repeatedly performed until the read value reaches a predetermined value (e.g., a voltage lower than the set voltage value by a predetermined magnitude). The increase in voltage is determined by a ramp voltage and the number of pulses. For example, when the ramp voltage is 11 to 21 V, and the number of pulses is 45, the step of a rough write voltage is (21−11)/45≠0.22 V.

By the same method, a write and read are repeatedly performed until the read value reaches a voltage to be written by setting a high voltage for a write whose read value has reached the predetermined value with a finer voltage change gradient within a shorter application time of the high voltage for a write to the memory cell.

This method realizes a write of analog values. However, the time necessary for a write is as long as (pulse width used for one write)×(number of pulses), e.g., 100 μsec×45+50 μsec×90=9.0 msec.

The technique of controlling a write while monitoring a reference value and a memory output by a comparator will be explained.

In this technique, the memory cell (circuit) is constituted as shown in FIG. 9, and "0" is written in all memory cells as initialization. A voltage to be written is set as a reference voltage in a comparator 901. In the next step, Vpp is applied to a floating gate 902 to extract electrons. The voltage of the floating gate 902 at this time is always monitored by a source follower operation. When an output value from the memory cell reaches the voltage to be written, a transistor 903 is turned on by an output from the comparator 901 to complete a write.

In this case, since a write and read need not be alternately repeated, one write time can be shortened to about 1 msec though it depends on an FN current amount. However, all memory cells must be reset as initialization before a write. In addition, a write value is monitored by a source follower operation, and a write is controlled by a feedback mechanism using the comparator to stop the operation at desired write voltage. This requires a peripheral control circuit, complicates the circuit design, and increases the chip size.

In either method, a written value is monitored by any means, and when the floating gate voltage reaches a voltage to be written, application of the programming voltage is stopped to end a write. As a result, the write time and a peripheral circuit are increased.

As described above, in the prior art, analog values or multilevel digital values are difficult to write. When analog values or multilevel digital values are to be recorded, initialization must be performed. In a flash memory having a memory capacity of about 8 MB, this initialization generally spends 1 sec or more.

Note that the memory cell may comprise a dedicated third gate 1001, as shown in FIG. 10, so as to apply a relatively high voltage in an erase in order to shorten the erase time.

SUMMARY OF THE INVENTION

The present invention has been made to solve the above problems, and has as its object to store analog data or multilevel digital data at a higher speed.

To achieve the above object, according to the present invention, there is provided a semiconductor memory device comprising a memory cell having a floating gate formed on a semiconductor substrate via a gate insulating film to be insulated from a remaining part, and a control gate formed on the floating gate via an isolation insulating film, a first electrode formed on the floating gate via a first insulating film in a region of the floating gate except for a channel region for constituting the memory cell, and a second electrode formed on the floating gate via a second insulating film in a region of the floating gate except for the channel region for constituting the memory cell, wherein when a predetermined voltage is applied to the first and second electrodes, a tunnel current flows through the first and second insulating films.

BRIEF DESCRIPTION OF THE INVENTION

FIG. 2 is a timing chart for explaining operation of the memory cell of the semiconductor memory device in FIGS. 1A, 1B, and 1C;

FIG. 3 is a sectional view showing the structure of a semiconductor memory device according to another embodiment of the present invention;

FIGS. 4A and 4B are circuit diagrams showing an example of the layout of the memory cell shown in FIGS. 1A, 1B, and 1C;

DESCRIPTION OF THE PREFERRED EMBODIMENTS

Embodiments of the present invention will be described below with reference to the accompanying drawings.

Figure 1A:
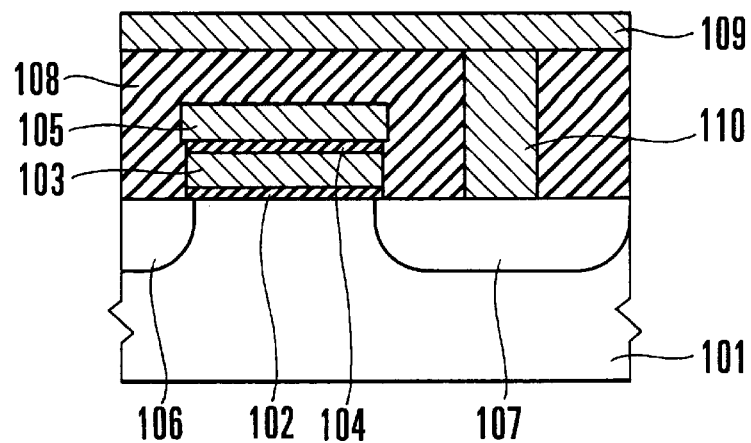
FIGS. 1 and 1B and FIG. 1C are sectional views and a plan view, respectively, showing the structure of a semiconductor memory device according to an embodiment of the present invention.
Figure 1B:
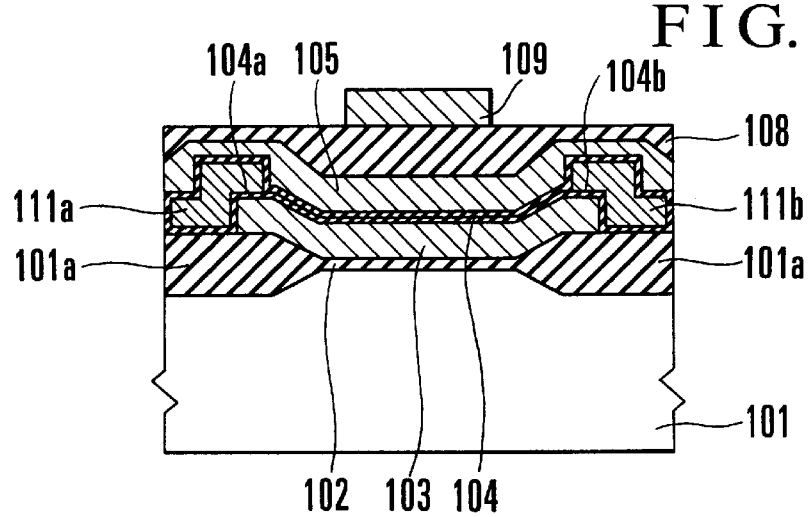
Figure 1C:
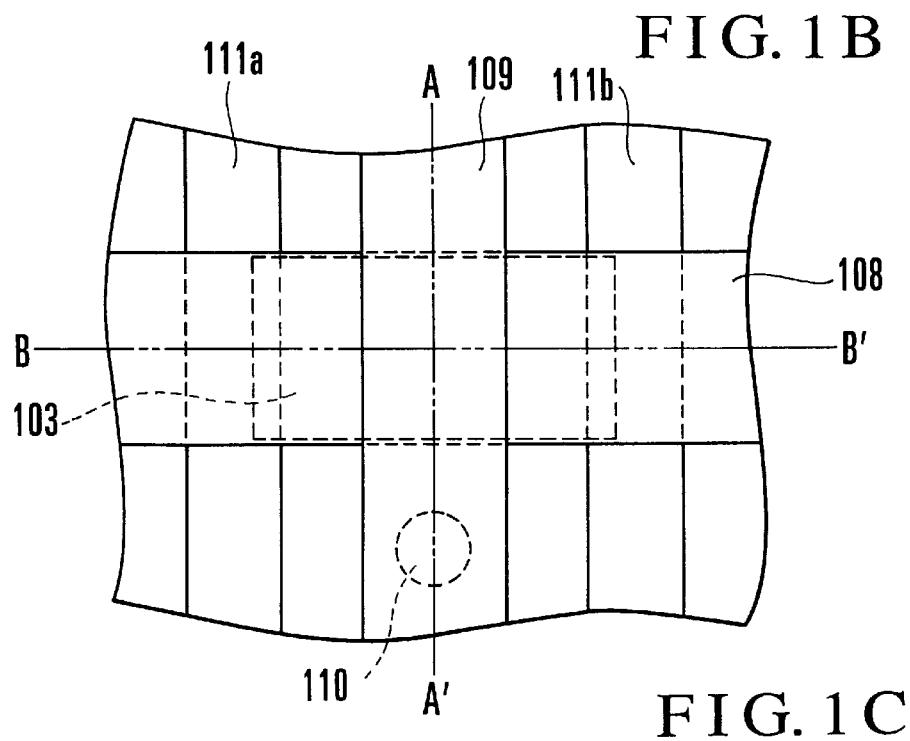

FIGS. 1A, 1B, and 1C show the structure of a semiconductor memory device according to an embodiment of the present invention. FIGS. 1A and 1B show section views of the memory cell, and FIG. 1C shows the planar arrangement.

The structure of the semiconductor memory device will be explained. A floating gate 103 of, e.g., polysilicon is formed in a region partitioned by element isolation regions 101a on a p-type semiconductor substrate 101 via a gate insulating film 102. The floating gate 103 is isolated from the remaining part.

A polysilicon control gate 105 is formed on the floating gate 103 via an isolation insulating film 104. A source 106 and drain 107 doped with an n-type impurity are formed on two sides of the floating gate 103 along the gate length in the semiconductor substrate 101. An interlayer insulating film 108 covers the control gate 105, and a bit line 109 is formed on the interlevel film 108. The bit line 109 is connected to the drain 107 via a contact 110 formed in the interlayer film 108.

In this embodiment, as shown in FIGS. 1B and 1C, two polysilicon programming electrodes 111a and 111b (first and second electrodes) are formed via charge injection windows 104a and 104b forming part of the insulating film 104 so as to overlap the two ends of the floating gate 103.

The programming electrodes 111a and 111b are sandwiched between the floating and control gates 103 and 105 at the two ends of the floating gate 103 so as to be insulated from the floating and control gates 103 and 105. The programming electrodes 111a and 111b overlap the two ends of the floating gate 103 at the ends of the element isolation regions 101a.

When a voltage equal to or higher than a predetermined value is applied to the programming electrodes 111a and 111b, a tunnel current flows between the programming electrodes 111a and 111b and floating gate 103 via the charge injection windows 104a and 104b.

Operation in the memory cell of the semiconductor memory device will be described with reference to the timing chart in FIG. 2. In the following description, C1 represents the capacitance between the floating and control gates 103 and 105, C2 represents the sum of the capacitance between the floating gate 103 and ground and the capacitance between the floating gate 103 and programming electrodes 111a and 111b, Vi represents a voltage to be written, Vc represents a potential applied to the control gate 105, Vf represents the potential of the floating gate 103, and $V_0$ represents the initial potential of the floating gate 103.

In an initial state, Vf=−V$_0$ (V) and Vc is 0 V.

If the potential of the control gate 105 is changed from this state to the setting value Vi (Vc=Vi), Vf is given by $$Vf=C1/(C1+C2) \times Vi - V_0 \quad (1)$$

At time t1, high voltages V$_{pp+}$ and V$_{pp−}$ (programming voltages) which is enough to flow a tunnel current through the charge injection windows 104a and 104b are respectively applied to the programming electrodes 111a and 111b. Then, the potential Vf of the floating gate 103 gradually comes near to an intermediate potential between V$_{pp+}$ and V$_{pp−}$, i.e., a zero-point potential. By applying V$_{pp+}$ and V$_{pp−}$ for a predetermined time (e.g., 1 ms), the potential Vf of the floating gate 103 can be changed to 0 V at time t2.

At time t2, the voltages applied to the programming electrodes 111a and 111b are set lower than the voltages at which a tunnel current starts flowing through the charge injection windows 104a and 104b, thereby stopping the flowing tunnel current.

If Vc is 0 V at time t2, the potential Vf of the floating gate 103 is given by $$Vf = -C1/(C1+C2) \times Vi \quad (2)$$

The analog voltage Vi to be written is recorded in the floating gate 103 regardless of the initial potential V$_0$.

As described above, according to this embodiment, while a write voltage having a desired value is applied to the control gate 105, a predetermined voltage is applied to the two programming electrodes 111a and 111b. When the potential of the floating gate 103 reaches a zero-point potential, application of the voltage to the programming electrodes 111a and 111b is stopped. By stopping application of the voltage to the control gate 105, the write voltage having a desired value is written in the floating gate 103 regardless of the initial state of the floating gate 103.

If a read voltage Vr (e.g., 5 V) is applied to the control gate 105 at, e.g., a time interval between times t3 and t4, the potential Vf of the floating gate 103 can be read out as an analog voltage corresponding to the voltage Vi, as represented by $$Vf = C1/(C1+C2) \times (Vr - Vi) \quad (3)$$

The analog voltage is read out as a current value corresponding to the potential of the floating gate 103 using, e.g., a source follower circuit.

The voltages applied to the two independent programming electrodes 111a and 111b are not limited to combinations of V$_{pp+}$ and V$_{pp−}$ having the same absolute value and different polarities. The voltages may be combinations of voltages having the same polarity and different absolute values or combinations of voltages having different polarities and absolute values. That is, voltages with sufficient potential difference to cause a tunnel current to flow through the charge injection windows 104a and 104b. Such voltages allow setting the equilibrium potential of the floating gate 103 to an arbitrary value to widen the degree of freedom of design. In other words, since the intermediate potential of the floating gate can be set to a value other than 0 V, the setting value (Vi) can be recorded with an offset.

In the above embodiment, the two programming electrodes are partially formed on the floating gate. However, the present invention is not limited to this, and the two programming electrodes may be partially formed below the floating gate.

The floating gate 103 and programming electrodes 111a and 111b must be formed from impurity-doped polysilicon in consideration of the following. The state of a polysilicon surface (the state at the interface with an insulating film) is generally related to tunnel current characteristics. As the density of projections called asperities on the polysilicon surface increases, the tunnel current amount per unit time increases.

The asperity density on the polysilicon surface can be controlled by process conditions, but the asperity density on the lower surface is difficult to control. For this reason, the floating gate and programming electrodes are constituted as shown in FIG. 3 to control tunnel current characteristics.

The structure of this semiconductor memory device will be described. A floating gate 303 of, e.g., polysilicon is formed in a region partitioned by element isolation regions 301a on a p-type semiconductor substrate 301 via a gate insulating film 302. The floating gate 303 is isolated from the remaining part.

A polysilicon control gate 305 is formed on the floating gate 303 via an isolation insulating film 304. A source and drain doped with an n-type impurity (neither is shown) are formed on two sides of the floating gate 303 along the gate length in the semiconductor substrate 301. An interlayer insulating film 308 covers the control gate 305, and a bit line 309 is formed on the interlayer film 308. The bit line 309 is connected to the drain via a contact (not shown) formed in the interlayer film 308.

In the structure of FIG. 3, part of a programming electrode 311a is formed below one end of the floating gate 303 via a charge injection window 324a at one end of the floating gate 303. Part of a programming electrode 311b is formed on the other end of the floating gate 303 via a charge injection window 304b at the other end of the floating gate 303.

When a voltage equal to or higher than a predetermined value is applied to the programming electrodes 311a and 311b, a tunnel current flows between the programming electrodes 311a and 311b and floating gate 303 via the charge injection windows 324a and 304b.

In this structure, since the charge injection window 324a is formed above the programming electrode 311a at the interface between the programming electrode 311a and charge injection window 324a, the asperity density on the surface of the polysilicon programming electrode 311a can be controlled. Since the charge injection window 304b is formed on the floating gate 303, the asperity density on the surface of the polysilicon floating gate 303 can also be controlled at this interface.

The current density of the current flowing from programming electrode 311a through the charge injection window 324a to the floating gate 303 can be made equal to the current density of the current flowing from floating gate 303 to the charge injection window 304b to the programming electrode 311b.

The programming voltage is simultaneously applied to the programming electrodes 111a and 111b in the structure shown in FIGS. 1A, 1B, and 1C, but the present invention is not limited to this. If the programming voltage is alternately applied to the programming electrodes 111a and 111b, no through current flowing through the floating gate 103 can be generated to suppress the write power in programming.

A method to prevent flowing the through current will be described.

In general, the threshold at which a tunnel current starts flowing through the charge injection windows 104a and 104b is about 8 V. The voltage V$_{pp}$ applied to the programming electrodes 111a and 111b is set lower than the threshold of the tunnel window by about 2 V so as not to flow any tunnel current in a steady state in programming. For example, +6 V is applied to the programming electrode 111a, and −6V is applied to the programming electrode 111b.

In this state, an AC bias voltage (e.g., 100 kHz/5 $V_{pp}$) is applied to the control gate 105 together with the write setting voltage (Vi). By additionally applying the AC bias voltage, when the AC bias voltage becomes lower than a given potential, a tunnel current starts flowing through only the charge injection window 104a of the programming electrode 111a. When the AC voltage becomes higher than the given potential, a tunnel current starts flowing through only the charge injection window 104b of the programming electrode 111b. No tunnel current simultaneously flows through both the charge injection windows 104a and 104b, and the floating gate 103 can be set to an intermediate potential between $V_{pp+}$ and $V_{pp-}$ without flowing any through current.

Instead of additionally applying the AC voltage to the control gate 105, an in-phase AC voltage may be applied to the two programming electrodes 111a and 111b to obtain the same results.

More specifically, similar to the above method, +6 V is applied to the programming electrode 111a, and −6 V is applied to the programming electrode 111b. The write setting voltage (Vi) is applied to the control gate 105.

In this state, a voltage in addition to an in-phase AC bias voltage (100 kHz/5 $V_{pp}$) is applied to the programming electrodes 111a and 111b. When the AC voltage becomes equal to or higher than a given potential, a tunnel current starts flowing through only the charge injection window 104a. When the AC voltage becomes lower than the given potential, a tunnel current starts flowing through only the charge injection window 104b. In this way, the floating gate 103 can be set to an intermediate potential without simultaneously flowing a current through both the charge injection windows 104a and 104b.

A voltage drop of the threshold voltage in a read can be suppressed by arranging a plurality of memory cells 401 each having the structure shown in FIGS. 1A, 1B, and 1C and using a dummy cell 402 having the same structure, as shown in FIG. 4A.

That is, outputs from the dummy cell 402 and a $V_{pp}$ voltage generation circuit are input to and added by an operational amplifier 403, and the sum is applied to the programming electrode of the memory cell 401, thereby increasing the equilibrium potential point of the floating gate of the memory cell 401 by the threshold voltage (Vth) of the dummy cell 402. In other words, a voltage drop of the threshold voltage in a read can be canceled by adding a value corresponding to the voltage drop to the floating gate of the memory cell 401 in advance. Even if the write setting voltage (Vi) applied to the control gate of the memory cell 401 is increased by the threshold voltage (Vth) of the dummy cell 402 in advance, the same results can be obtained. This may be realized by offsetting the voltage $V_{pp}$ on the basis of a reference voltage other than the dummy cell, as shown in FIG. 4B.

Figure 5A:
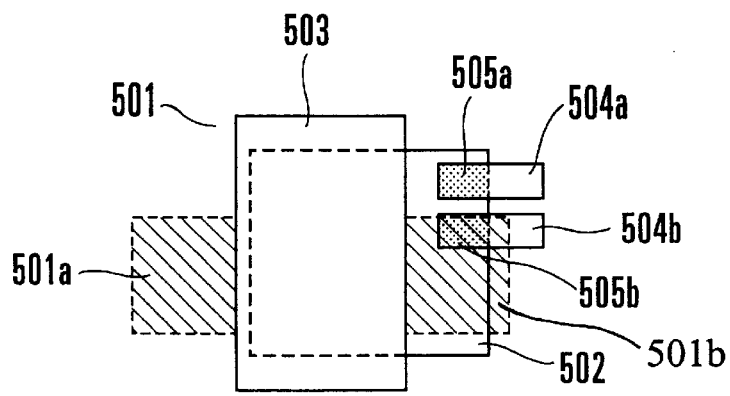
FIGS. 5A and 5B are plan views, respectively, showing the structure of a semiconductor memory device according to still another embodiment of the present invention.
Figure 5B:
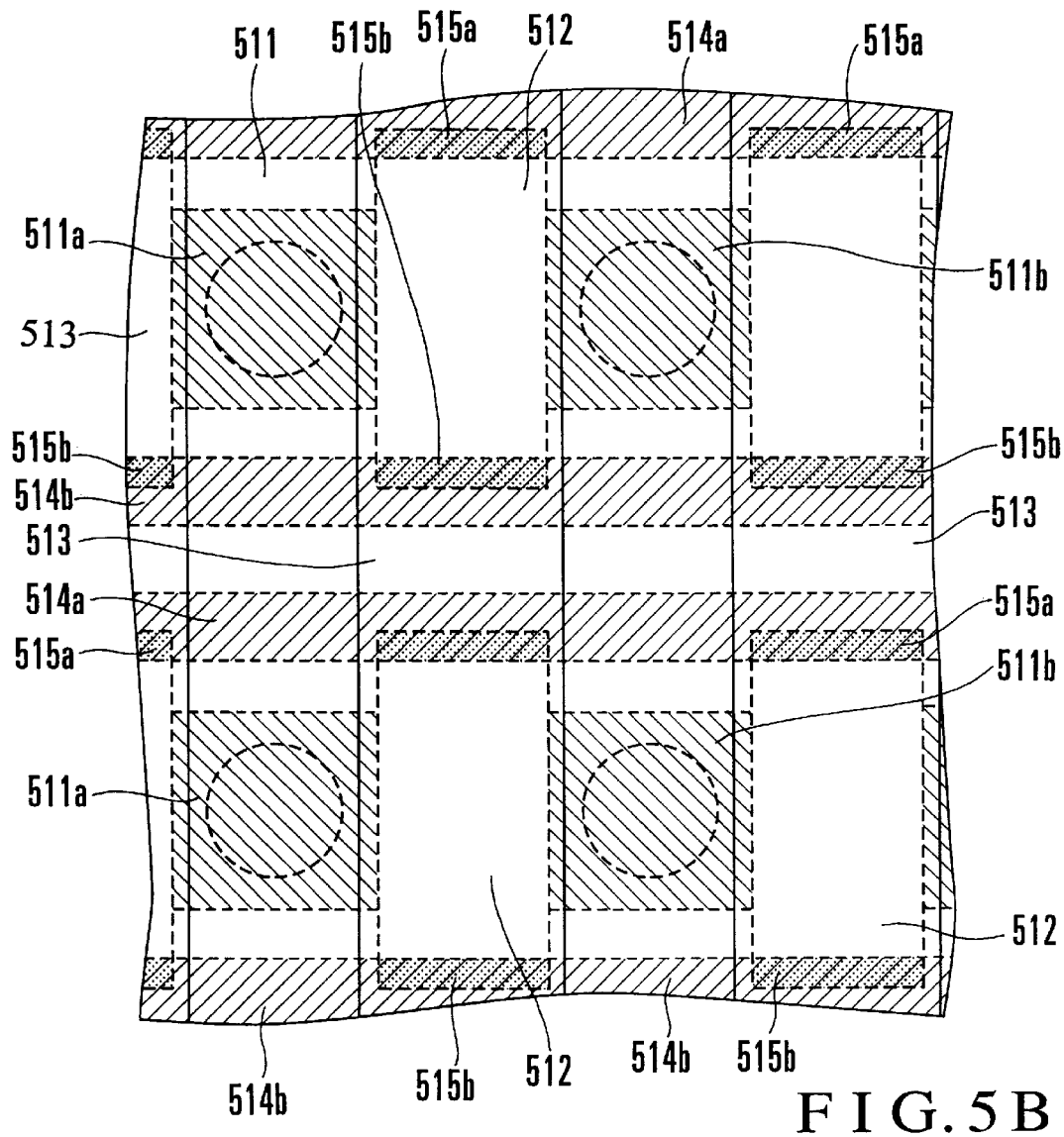
Figure 6:
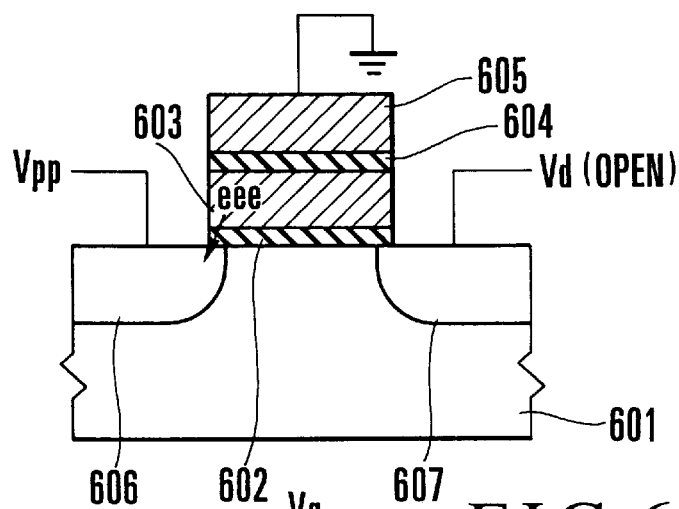
FIGS. 6A and 6B are sectional views, respectively, showing the structure of a conventional semiconductor memory device.
Figure 6:
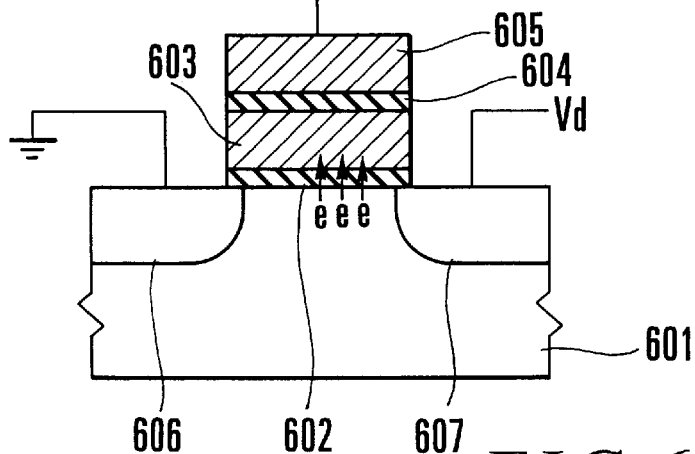
Figure 7:
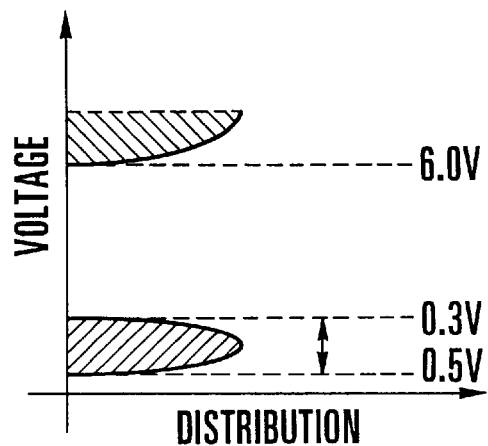
FIG. 7 is a graph showing the threshold distribution of a memory cell erased/written by an intelligent erase method.
Figure 8:
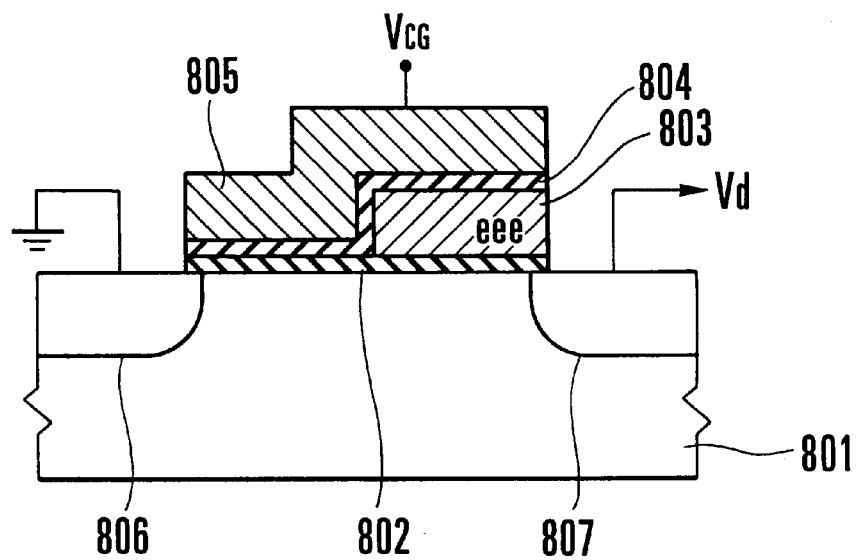
FIG. 8 is a sectional view showing the structure of a conventional split gate type nonvolatile memory (the structure of a memory cell)
Figure 9:
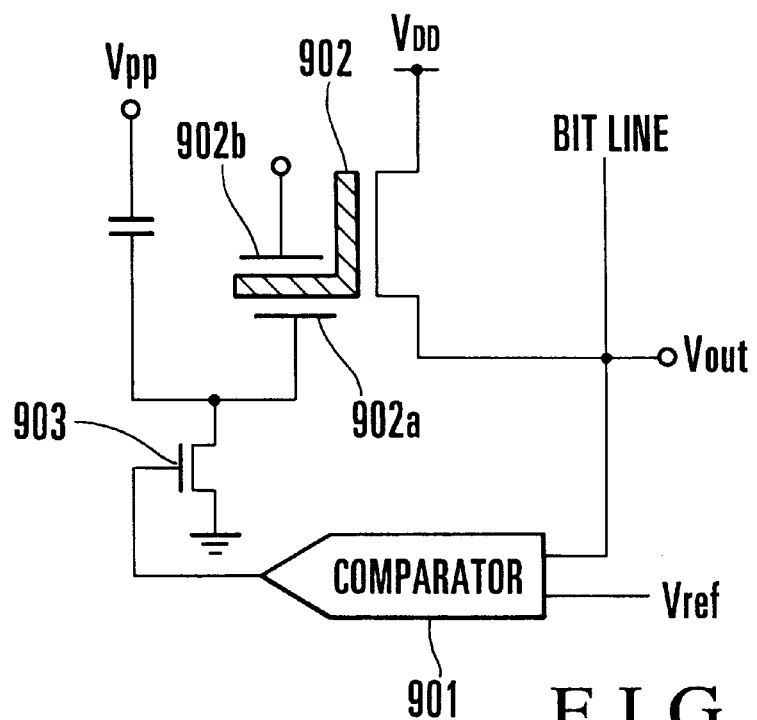
FIG. 9 is a circuit diagram showing the structure of a memory cell using a technique of controlling a write while monitoring a reference value and a memory output by a comparator.
Figure 10:
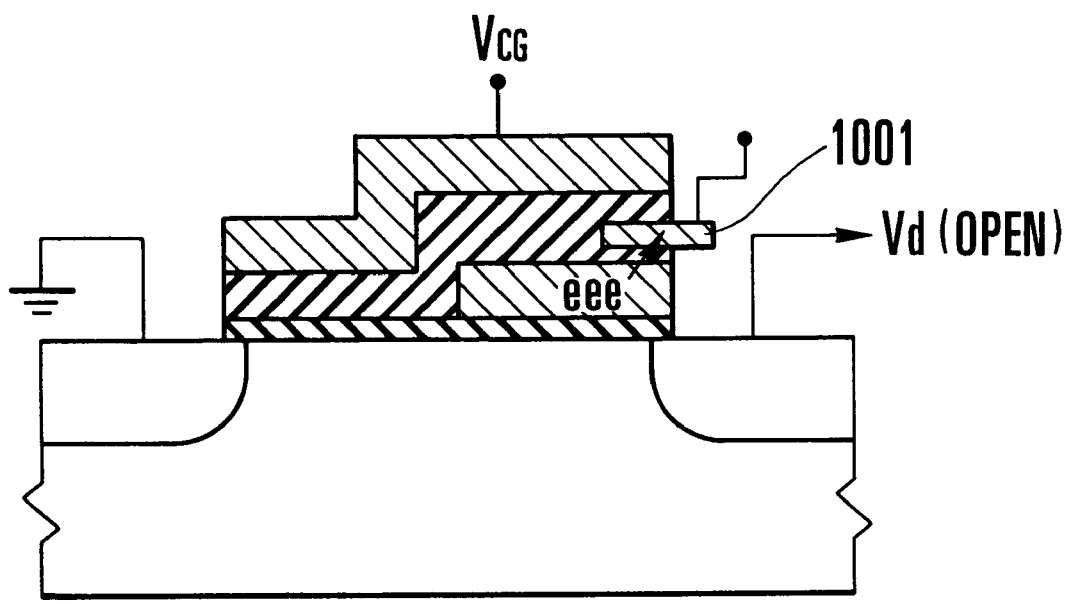
FIG. 10 is a sectional view showing the structure of another conventional semiconductor memory device.

As another embodiment of the present invention, the memory cell may be constituted as shown in FIGS. 5A and 5B.

In FIG. 5A, a floating gate 502 is formed on a silicon substrate 501 via a gate insulating film (not shown), and a control gate 503 is formed on the floating gate 502 via an isolation insulating film (not shown). A source 501a and drain 501b are formed in predetermined regions of the silicon substrate 501.

In the memory cell of FIG. 5A, the floating gate 502 projects toward the drain 501b, and two programming electrodes 504a and 504b partially overlap this projecting region. In this memory cell, when a voltage equal to or higher than a predetermined value is applied to the programming electrodes 504a and 504b, a tunnel current flows between the programming electrodes 504a and 504b and floating gate 502 via charge injection windows 505a and 505b.

In FIG. 5B, a floating gate 512 is formed on a silicon substrate 511 via a gate insulating film (not shown), and a control gate 513 is formed on the floating gate 512 via an isolation insulating film (not shown). A source 511a and drain 511b are formed in predetermined regions of the silicon substrate 511.

In the memory cell of FIG. 5B, the floating gate 512 extends in a direction perpendicular to the direction of gate length of a transistor made up of the source 511a, drain 511b, floating gate 512, and control gate 513.

In addition, in the memory cell of FIG. 5B, impurity doped regions 514a and 514b are formed in the silicon substrate 511 below the extending region of the floating gate 512 via an insulating film (not shown). With this structure, the impurity doped regions 514a and 514b are used as the above-mentioned programming electrodes.

In the memory cell of FIG. 5B, when a voltage equal to or higher than a predetermined value is applied to the impurity doped regions 514a and 514b, a tunnel current flows between the impurity doped regions 514a and 514b and floating gate 512 via charge injection windows 515a and 515b. In this case, the impurity doped regions 514a and 514b are doped with an n-type impurity.

As has been described above, according to the present invention, the first electrode is formed on the floating gate via the first insulating film in a region of the floating gate except for the channel region for constituting the memory cell, and the second electrode is formed on the floating gate via the second insulating film in a region of the floating gate except for the channel region for constituting the memory cell. When a redetermined voltage is applied to the first and second electrodes, a tunnel current flows through the first and second insulating films.

In this structure, when, e.g., positive and negative voltages at which a tunnel current starts flowing through the first and second insulating films are respectively applied to the first and second electrodes, the potential of the floating gate can be set to an intermediate potential between the positive and negative voltages.

More specifically, while a write voltage having a desired value is applied to the control gate, the above predetermined voltages are respectively applied to the two, first and second electrodes. When the potential of the floating gate reaches a zero-point potential, application of the voltages to the first and second electrodes is stopped. By stopping application of the voltage to the control gate, a write voltage having a desired analog value is written in the floating gate regardless of the initial state of the floating gate.

As a result, according to the present invention, an analog value can be stably, easily written. Further, an operation for only an erase and an operation of verifying a written value can be omitted. Data can be written regardless of the initial state of the memory cell. Therefore, analog data or multi-level digital data can be stored at a higher speed.

What is claimed is:

1. A semiconductor memory device comprising:
   a memory cell having a floating gate formed on a semiconductor substrate via a gate insulating film to be insulated from a remaining part, a control gate formed on the floating gate via an isolation insulating film;
   a first electrode over the substrate, formed to overlap a region of the floating gate other than regions of the floating gate extending over a channel region, the first electrode being insulated from the floating gate via a first insulating film; and a second electrode over the substrate, formed to overlap a region of the floating gate other than regions of the floating gate extending over the channel region, the second electrode being insulated from the floating gate via a second insulating film, wherein when a predetermined voltage is applied to said first and second electrodes, a tunnel current flows through the first and second insulating films.

2. A device according to claim 1, wherein at least parts of said first and second electrodes are formed on the floating gate.

3. A device according to claim 1, wherein at least parts of said first and second electrodes are formed below the floating gate.

4. A device according to claim 1, wherein part of said first electrode is formed below the floating gate, and part of said second electrode is formed on the floating gate.

5. A device according to claim 1, wherein at least one of said first and second electrodes is formed from an impurity region formed in the semiconductor substrate.

6. A device according to claim 1, wherein said first and second electrodes receive voltages having different polarities and the same absolute value.

* * * * *